(12) United States Patent
Okamoto et al.

(10) Patent No.: US 7,264,407 B2
(45) Date of Patent: Sep. 4, 2007

(54) OPTICAL DEVICE, METHOD FOR FABRICATING OPTICAL DEVICE, CAP COMPONENT, AND METHOD FOR FORMING CAP COMPONENT

(75) Inventors: Shigeki Okamoto, Kyoto (JP); Masaya Tateyanagi, Shiga (JP); Masanori Mimamio, Osaka (JP); Kiyoshi Fujihara, Shiga (JP); Hiroyuki Ishida, Osaka (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 261 days.

(21) Appl. No.: 10/980,154

(22) Filed: Nov. 4, 2004

(65) Prior Publication Data

US 2005/0152634 A1    Jul. 14, 2005

(30) Foreign Application Priority Data

Jan. 14, 2004  (JP) ............................. 2004-006471
Sep. 27, 2004  (JP) ............................. 2004-279303

(51) Int. Cl.
*G02B 6/36* (2006.01)
*G02B 6/12* (2006.01)

(52) U.S. Cl. .......................................... 385/92; 385/14
(58) Field of Classification Search ............ 385/92–94, 385/14; 360/245.9
See application file for complete search history.

(56) References Cited

U.S. PATENT DOCUMENTS

| | | | |
|---|---|---|---|
| 6,501,661 B1 * | 12/2002 | Moore et al. ................ | 361/752 |
| 6,772,733 B2 * | 8/2004 | Shi et al. ................ | 123/406.12 |
| 6,925,980 B2 * | 8/2005 | Glovatsky .............. | 123/184.21 |
| 7,021,836 B2 * | 4/2006 | Anderson et al. ............. | 385/89 |
| 7,044,661 B2 * | 5/2006 | Kandar-Kallen et al. ..... | 385/94 |
| 2005/0274882 A1 * | 12/2005 | Minamio et al. ........... | 250/239 |
| 2006/0083459 A1 * | 4/2006 | Minamio et al. ............. | 385/14 |
| 2006/0092812 A1 * | 5/2006 | Tateyanagi et al. ..... | 369/112.01 |

FOREIGN PATENT DOCUMENTS

| | | |
|---|---|---|
| JP | 2001-111159 | 4/2001 |
| JP | 2002-298410 | 10/2002 |

\* cited by examiner

*Primary Examiner*—Frank G. Font
*Assistant Examiner*—Charlie Peng
(74) *Attorney, Agent, or Firm*—McDermott Will & Emery LLP

(57) ABSTRACT

An optical device includes a copper plate, light receiving elements mounted on the copper plate, a light emitting element mounted on the light receiving elements, a flexible substrate bent to cover portions of upper and side surfaces of the copper plate, and a positioning frame of metal for fixing the flexible substrate and the copper plate to each other. Since the positioning frame secures the flexible substrate and the copper plate against movement, a thin optical device can be attained without employing a resin-molded construction.

20 Claims, 8 Drawing Sheets

OPTICAL DEVICE, METHOD FOR FABRICATING OPTICAL DEVICE, CAP COMPONENT, AND METHOD FOR FORMING CAP COMPONENT

BACKGROUND OF THE INVENTION (a) Fields of the Invention

The present invention relates to optical devices which are made by mounting on a mounting substrate a light receiving element such as an image sensor or a light emitting/receiving element such as a laser emitting element, and to cap components for use in the optical devices.

(b) Description of Related Art

Conventionally, optical devices (for example, hologram units) have been commonly used which are made by mounting on a mounting substrate light receiving elements such as image sensors or a light emitting element such as a laser emitting element. FIGS. 8A and 8B are perspective views showing conventional optical devices in which a hologram is not mounted and is mounted, respectively.

Referring to FIG. 8A, the conventional optical device includes an optical chip, a supporting member 104 of resin, and external terminals 105. The optical chip has a light emitting element 102 and light receiving elements 103 and is mounted on a lead frame 101 having a die-pad and leads. The supporting member 104 of resin seals the light receiving elements 103 and the lead frame. The external terminals 105 widthwide protrude from the side portions of the supporting member 104. As shown in FIG. 8B, if a hologram 106 is mounted in the optical device, the device is employed as a hologram unit. However, the hologram 106 is not always required, and in such a case, the device is constructed so that a glass window is put over the supporting member 104.

SUMMARY OF THE INVENTION

As recent equipment mounting optical devices is downsized, restrictions on the thickness or other dimensions of each of the devices become severer. However, since the conventional optical devices as shown in FIGS. 8A and 8B employ constructions based on the premise that the devices are resin-molded, it is gradually becoming difficult for the devices to fully accomplish demanded reduction in dimension. For example, because of restriction on the thickness of the optical device, a severe limitation is imposed also on the thicknesses of ribs 104a of the supporting member 104 shown in FIG. 8A. If the device employs a resin-molded construction to ensure the flow and strength of sealing resin in a resin-sealing process, however, there is a limit to reduction in thickness of the rib 104a.

An object of the present invention is to reduce the thickness of an optical device by employing a construction different from the resin-molded construction and thus to enable downsizing of equipment mounting the optical device.

A first optical device of the present invention is provided with a flexible substrate which has a wiring pattern and is bent and disposed along an upper surface and both side surfaces of a base on which an element is disposed. Further, in the first optical device, the base is provided with a frame for setting a light-transmitting member.

With this device, the flexible substrate having been formed with a wiring pattern can be utilized to eliminate the necessity to employ a resin-molded construction for the device. This eliminates restriction on the dimension of the device induced by the necessity to ensure the flow of sealing resin, and also facilitates ensuring of the strength thereof. Therefore, the thickness of the optical device can be reduced, whereby the optical device can adapt to downsizing of equipment mounting the optical device.

The frame can be formed of a metal plate to attain the optical device with a high strength. Therefore, the thickness of the optical device can be further reduced.

Preferably, the frame secures the flexible substrate and the base against movement.

The frame is fitted to the flexible substrate to bring associated corners of the flexible substrate and the base into tight contact, which prevents an increase in thickness of the optical device resulting from an increased radius of curvature of the bent portion of the flexible substrate.

Generally, the light-transmitting member is a hologram or a window made of glass or plastic.

Preferably, the base is formed to fix the fixing position of the flexible substrate.

A second optical device of the present invention is provided with: a flexible substrate having a wiring pattern and disposed on a base on which an optical chip is set; and a frame for fixing the flexible substrate and the base to each other and setting a light-transmitting member.

This device uses the flexible substrate having been formed with a wiring pattern and is provided with the frame for fixing the flexible substrate and the base to each other. Thus, the necessity to employ a resin-molded construction for the device can be eliminated. This in turn eliminates restriction on the dimension of the device induced by the necessity to ensure the flow of sealing resin, and also facilitates ensuring of the strength thereof. Therefore, the thickness of the optical device can be reduced, whereby the optical device can adapt to downsizing of equipment mounting the optical device.

Generally, the light-transmitting member is a hologram or a window made of glass or plastic.

Preferably, the base is formed to fix the fixing position of the flexible substrate.

A cap component of the present invention is a component of the optical device described above, and formed by attaching a light-transmitting member to a frame with an adhesive layer interposed therebetween. The frame has a flat plate with an opening and a pair of side plates fitted to a flexible substrate.

The frame can be formed of a metal plate to maintain the mechanical strength of the device and downsize the device.

Preferably, the frame brings associated corners of the flexible substrate and the base into tight contact.

Generally, the light-transmitting member is a hologram or a window made of glass or plastic.

The adhesive layer is cured by light radiation and does not overflow 50 µm or greater outwardly from the light-transmitting member. With this procedure, a light-passing region can be sufficiently secured, which is advantageous to downsizing of the optical device.

A method for fabricating an optical device of the present invention is carried out in the following manner. A flexible substrate with a wiring pattern is bent along an upper surface and both side surfaces of a base and then a frame is fitted to the base and the flexible substrate to secure the base and the flexible substrate against movement. Thereafter, an optical chip is fixed on the base, the wiring pattern on the flexible substrate is electrically connected to the optical chip, and other fabrication steps are conducted.

With this method, a thin optical device can be attained without performing any resin-sealing process. In particular, if the flexible substrate is bent along the upper surface and the both side surfaces of the base and simultaneously the frame is fitted to the base and the flexible substrate, a thin optical device can be provided by extremely simple fabrication steps.

The method for fabricating an optical device can further comprise, prior to the step of fitting the frame to the base and the flexible substrate, the step of fixing the light-transmitting member to the frame with an adhesive to be cured by light radiation.

A method for forming a cap component of the present invention is a method for forming a cap component for use in the optical device described above, and carried out in the following manner. A frame of metal is prepared which includes a flat plate with an opening and a pair of side plates to be fitted to a flexible substrate, and an adhesive is applied to the flat plate of the frame or a light-transmitting member. Then, the light-transmitting member is put over the frame and ultraviolet light is radiated from the side of the flat plate of the frame opposite to the light-transmitting member to cure the adhesive.

With this method, the light is directly radiated to the adhesive nearly overflowing from a gap between the frame and the light-transmitting member onto the surface of the light-transmitting member, so that the adhesive is quickly cured to reduce the amount of the adhesive overflowing outside the light-transmitting member. Consequently, the light-passing region of the light-transmitting member can be sufficiently secured, which is advantageous to downsizing of the optical device.

In curing the adhesive, even though the adhesive is not heated by a heating apparatus, light is directly radiated to the portion of the frame close to the adhesive, thereby heating the frame of metal through the absorption of the light. Therefore, the adhesive can be cured only by the light radiation. Consequently, the fabrication system thereof can be simplified to reduce manufacturing costs of the cap component, and in turn the optical device.

The optical device and the method for fabricating the device according to the present invention can eliminate the necessity to employ a resin-molded construction. Therefore, the thickness of the optical device can be reduced, whereby the optical device can adapt to downsizing of equipment mounting the optical device.

The cap component and the method for forming the component according to the present invention can provide a component adapted to the optical device of the present invention.

DETAILED DESCRIPTION OF THE PREFERRED EMBODIMENTS

First Embodiment

Figure 1:
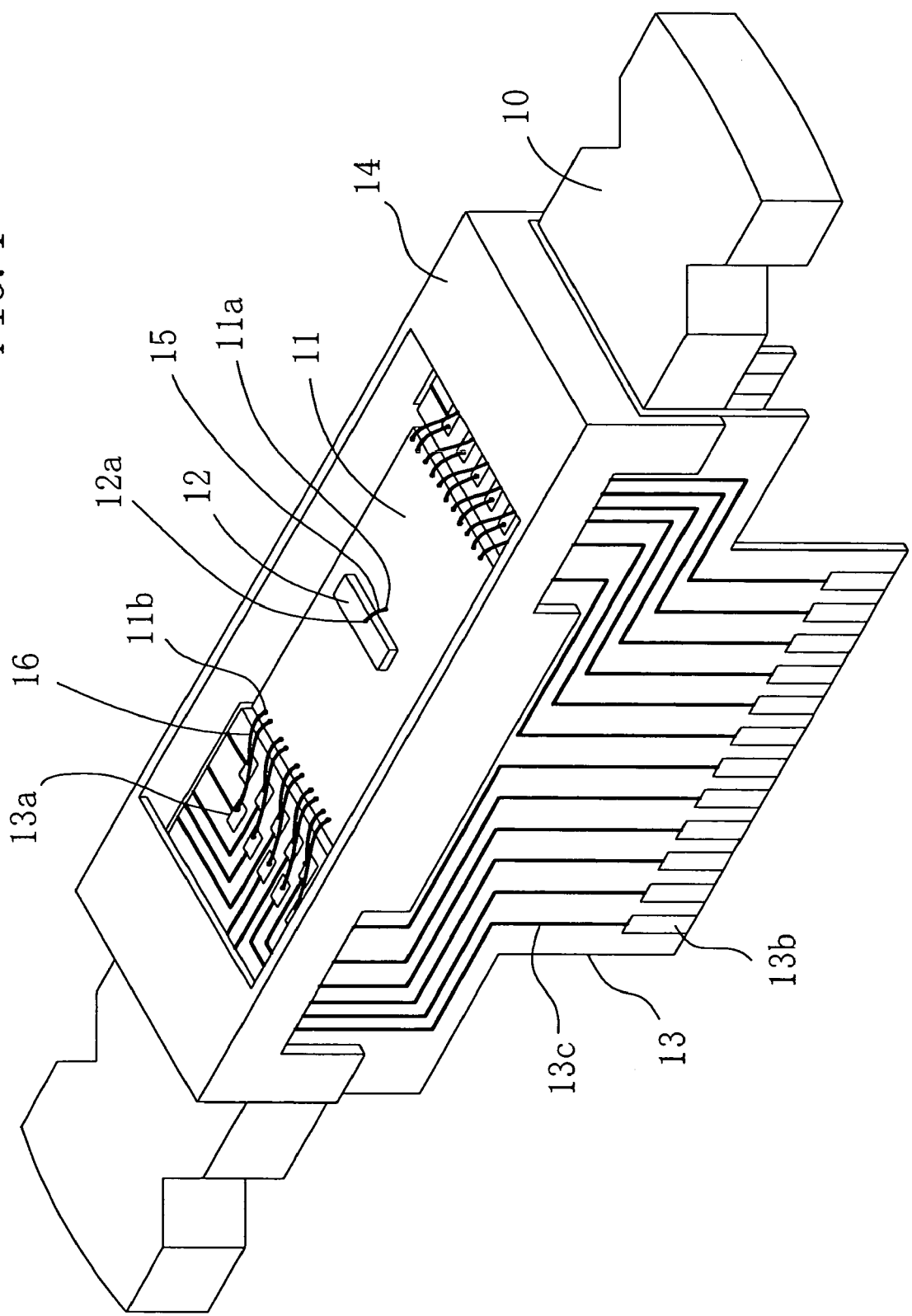
FIG. 1 is a perspective view showing the construction of an optical device according to a first embodiment of the present invention.

FIG. 1 is a perspective view showing the construction of an optical device according to a first embodiment of the present invention. Note that illustration of a hologram or a glass window is omitted in FIG. 1.

Referring to FIG. 1, the optical device of the first embodiment includes a copper plate 10, an optical chip, a flexible substrate 13, and a positioning frame 14. The copper plate 10 is a base having a cooling function. The optical chip mounts light receiving elements 11 and a light emitting element 12 mounted on the copper plate 10. The flexible substrate 13 is bent to cover portions of the upper and side surfaces of the copper plate 10. The positioning frame 14 is a frame of metal for fixing the flexible substrate 13 and the copper plate 10 to each other. The flexible substrate 13 is provided with a wiring pattern formed of internal terminals 13a, external terminals 13b, and wiring lines (printed wiring lines) 13c. The internal terminals 13a provide signal connection to the light receiving elements 11 and the light emitting element 12. The external terminals 13b provide signal connection to external equipment. The wiring lines 13c each connect the internal terminal 13a to the external terminal 13b. Fine metal wires 16 as signal-connecting members electrically connect the internal terminals 13a of the flexible substrate 13 to outer pad electrodes 11b of the light receiving elements 11, respectively. A fine metal wire 15 as a signal-connecting member electrically connects an inner pad electrode 11a of the optical chip to a pad electrode 12a of the light emitting element. That it to say, both the light receiving elements 11 and the light emitting element 12 are electrically connected to the wiring pattern of the flexible substrate 13. Both side portions of the flexible substrate 13 extend in the substantially perpendicular direction to the upper surface of the copper plate 10. The wording "extend in the substantially perpendicular direction" means that the flexible substrate 13 is designed so that the both side portions extend perpendicularly even though these portions are actually inclined at a slight degree from the perpendicular direction due to errors or variations in a fabrication process of the device. However, the both side portions may extend in a slightly diagonal direction, that is to say, in intersecting relation to the upper surface of the copper plate 10.

FIGS. 2A to 2D are perspective views showing assembly steps of the optical device according to the first embodiment.

Figure 2A:
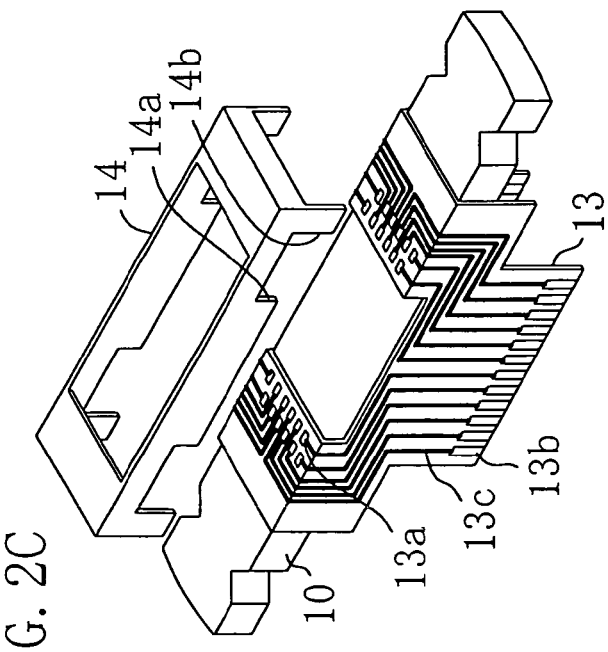
FIGS. 2A to 2D are perspective views showing assembly steps of the optical device according to the first embodiment of the present invention.

In the step shown in FIG. 2A, the flexible substrate 13 of a flat plate shape is put on the copper plate 10 and then the substrate and the plate are fixed with an adhesive. Note that the substrate and the plate do not have to be fixed with an adhesive. The center portion of the flexible substrate 13 is formed with an opening. The flexible substrate 13 is fixed on the copper plate 10 so that the center portion of the opening and the internal terminals 13a are located above the copper plate 10 and that the external terminals 13b are aligned to the both sides of the copper plate 10.

Figure 2B:
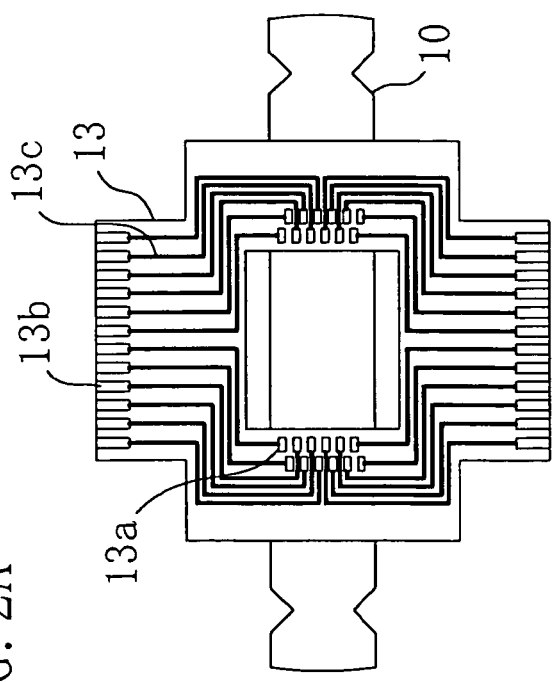

Subsequently, in the step shown in FIG. 2B, the flexible substrate 13 is bent along the upper surface and the side surfaces of the copper plate 10. By this bend, the external terminals 13b on the flexible substrate 13 are positioned below the copper plate 10.

Figure 2C:
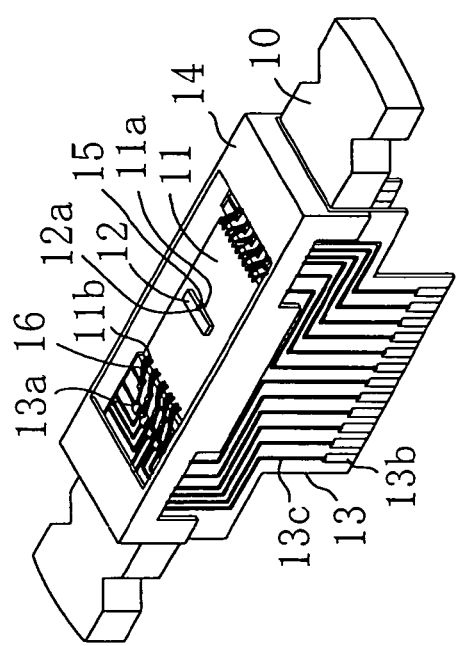
Figure 2D:
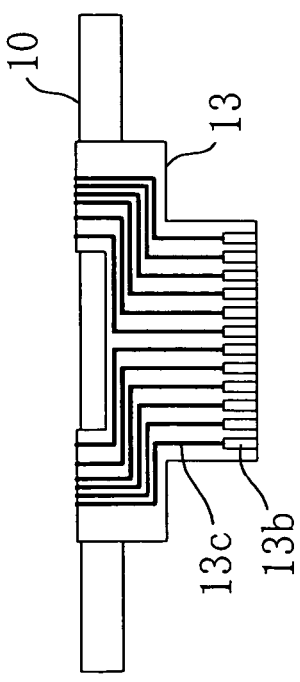

Next, in the steps shown in FIGS. 2C and 2D, the positioning frame 14 of metal fixes the copper plate 10 and the flexible substrate 13 to each other. Although not shown, in each of the side surfaces of the copper plate 10, a shallow groove has been formed whose width is substantially equal to that of the flexible substrate 13, and this groove positions the flexible substrate 13. The center parts 14a of the side portions of the positioning frame 14 are fitted to the copper plate 10 with an adhesive interposed therebetween, while the edge parts of the side portions of the positioning frame 14 are fitted to the flexible substrate 13 with an adhesive interposed therebetween. Alternatively, the entire side portions of the positioning frame 14 may be fitted to the flexible substrate 13. In this case, cuttings for separating the center part 14a from the edge parts 14b can be eliminated from the side portions of the positioning frame 14, and no shallow groove may be formed in the side surfaces of the copper plate 10.

The edge parts of the side portions of the positioning frame 14 may be fitted to the flexible substrate 13 not by interposing an adhesive therebetween but simply by applying tightening force thereto. In this case, after the step shown in FIG. 2A, the steps for providing the states shown in FIGS. 2B and 2C are not carried out. Instead of these steps, the positioning frame 14 is pressed down on the flexible substrate 13 to cover the flexible substrate 13, thereby bending the flexible substrate 13 along the upper surface and the side surfaces of the copper plate 10 and simultaneously fixing the flexible substrate 13 and the copper plate 10. This procedure can attain the construction shown in FIG. 1 by extremely simple fabrication steps.

As shown in FIG. 2D, the optical chip incorporating the light receiving elements 11 is secured to the copper plate 10 with an adhesive interposed therebetween, and then the light emitting element 12 is secured to the optical chip with an adhesive interposed therebetween. Subsequently to this, by wire bonding, the fine metal wire 15 electrically connects the internal terminal 13a of the flexible substrate 13 to the outer pad electrode 11b of the optical chip, and the fine metal wires 16 electrically connect the inner pad electrodes 11a of the optical chip to the pad electrodes 12a of the light emitting element 12, respectively. Thus, the construction of the optical device shown in FIG. 1 can be obtained.

Figure 3:
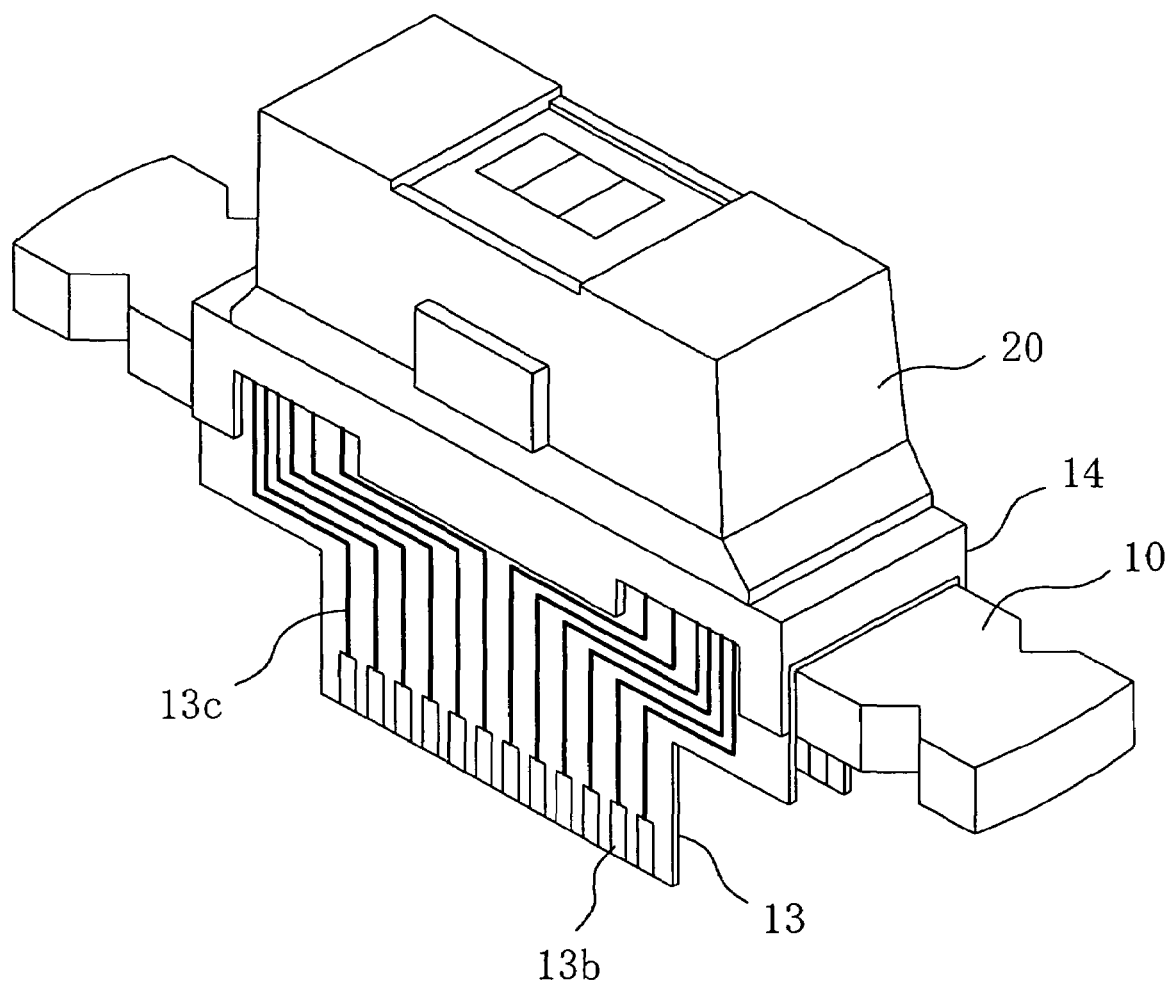
FIG. 3 is a perspective view showing the construction of an optical device according to the first embodiment of the present invention, which serves as a hologram unit made by putting a hologram over a positioning frame.
Figure 4:
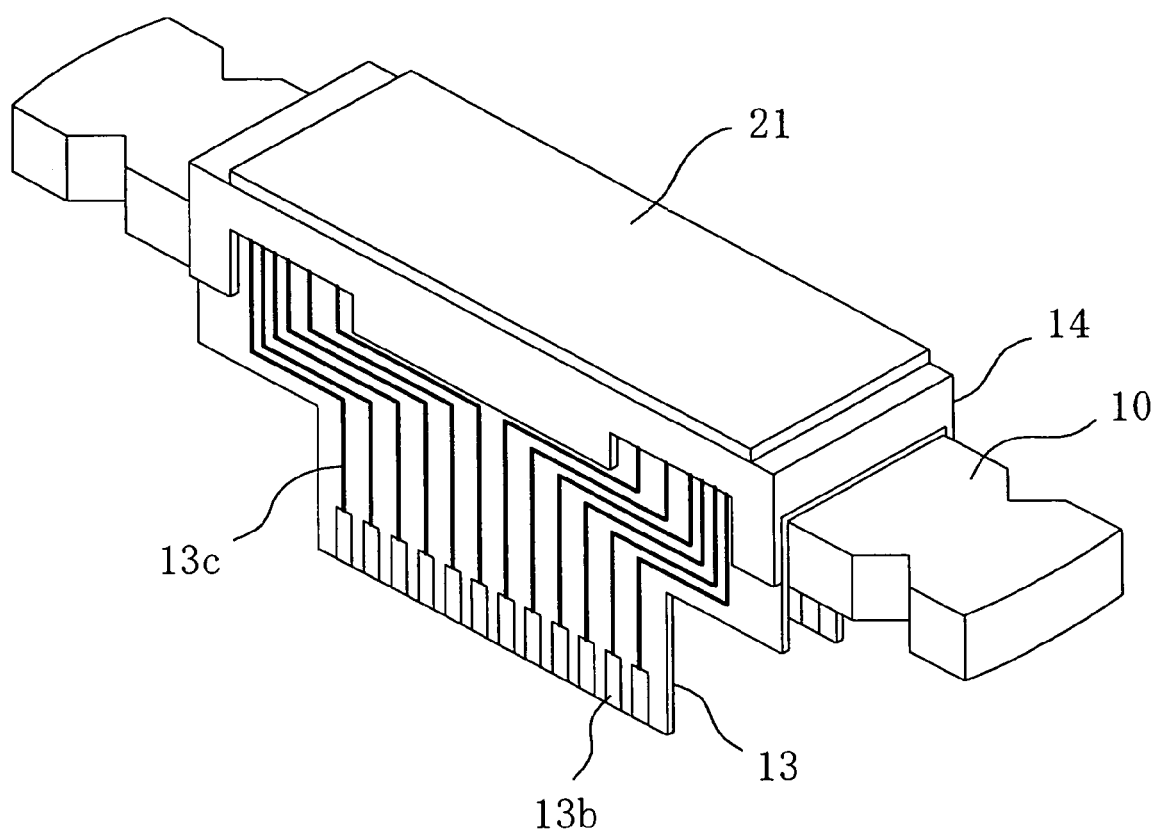
FIG. 4 is a perspective view showing the construction of an optical device according to the first embodiment of the present invention, which is made by putting a glass window over the positioning frame.

Subsequent steps vary depending on the presence or absence of a hologram. In one of these steps, a hologram, a glass window or the like is put over the positioning frame 14. FIG. 3 is a perspective view showing the construction of an optical device as a hologram unit made by putting a hologram 20 over the positioning frame 14. FIG. 4 is a perspective view showing the construction of an optical device made by putting a glass window 21 over the positioning frame 14.

In the first embodiment, the external terminals 13b of the flexible substrate 13 are connected (not shown) to terminals of another flexible substrate connected to external equipment.

Figure 8A:
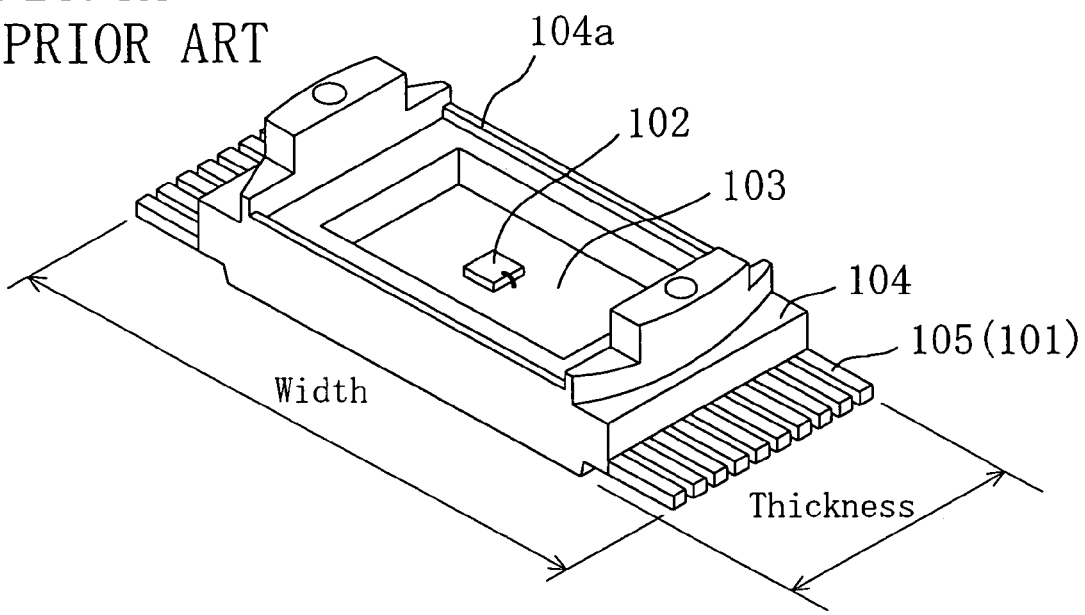
FIGS. 8A and 8B are perspective views showing conventional optical devices in which a hologram is not mounted and is mounted, respectively.
Figure 8B:
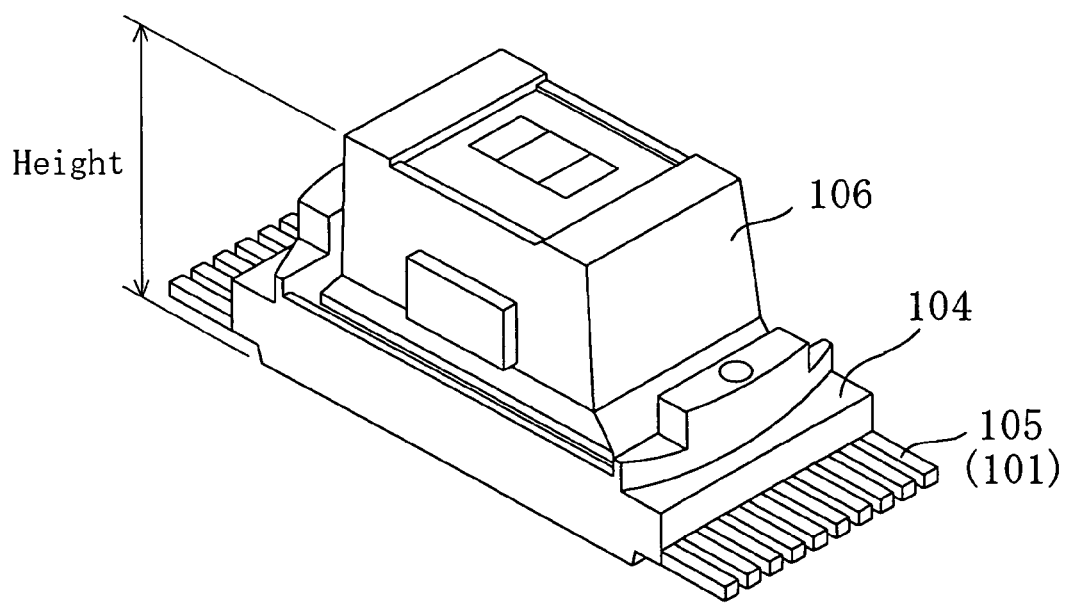

In the optical device of the first embodiment, the positioning frame 14 secures the flexible substrate 13 and the copper plate 10 against movement. Therefore, a thin optical device without having a resin-molded construction can be attained. Specifically, since the positioning frame 14 can be made of metal (for example, copper), the thickness of the frame can be readily reduced to be, for example, a thin film 0.1 mm thick unlike the rib 104a of the supporting member 104 of the conventional optical device shown in FIG. 8. This in turn reduces the thickness of the optical device (for example, to 3 mm or smaller). Accordingly, the optical device can readily adapt to downsizing of equipment or the like mounting the optical device.

Furthermore, the flexible substrate 13 is bent along the upper surface and the side surfaces of the copper plate 10 to make the both sides of the flexible substrate 13 extend perpendicularly to the mounting surface of the copper plate 10 (the surface thereof on which the optical chip having the light receiving elements 11 and the light emitting element 12 is mounted). Therefore, the number of external terminals for providing electrical connection to external equipment can be increased as compared to that of the conventional construction while an increase in thickness of the optical device (see FIG. 8A) is suppressed.

Moreover, the positioning frame 14 covers the bent corners of the flexible substrate 13. This certainly restricts an increase in thickness of the optical device due to an increased radius of curvature of the bent portion of the flexible substrate 13.

Furthermore, since the base having a cooling function is the copper plate 10, heat generated by the optical device in which a laser-beam emitting element or the like of high heating value is arranged can be dissipated immediately to cool the entire device.

In the first embodiment mentioned above, description has been made of the optical device provided with the optical chip including the light receiving elements 11 and the light emitting element 12. However, it is sufficient that the optical device according to the present invention includes, as an optical chip, at least one of the light receiving element and the light emitting element.

Instead of using the fine metal wires 15 and 16, the optical device can also be constructed using a well-known bump bonding.

The positioning frame 14 does not always have to have the function of bringing the corners of the flexible substrate 13 and the copper plate 10 into tight contact, and has only to be constructed so that a light-transmitting member such as a hologram or a glass window can be attached thereon.

Second Embodiment

In a second embodiment, description will be made of a structure and a formation method of a cap component employed for an optical device.

Figure 5A:
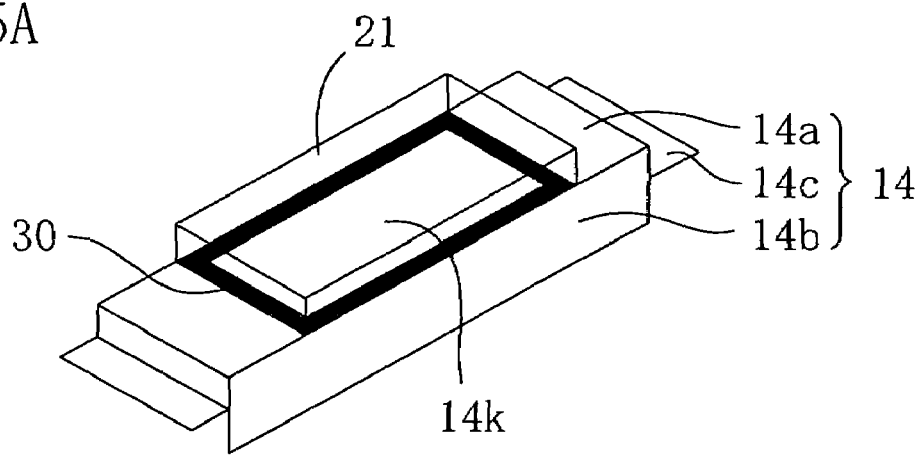
FIGS. 5A to 5C are perspective views showing the structures of three types of cap components according to a second embodiment of the present invention.
Figure 5B:
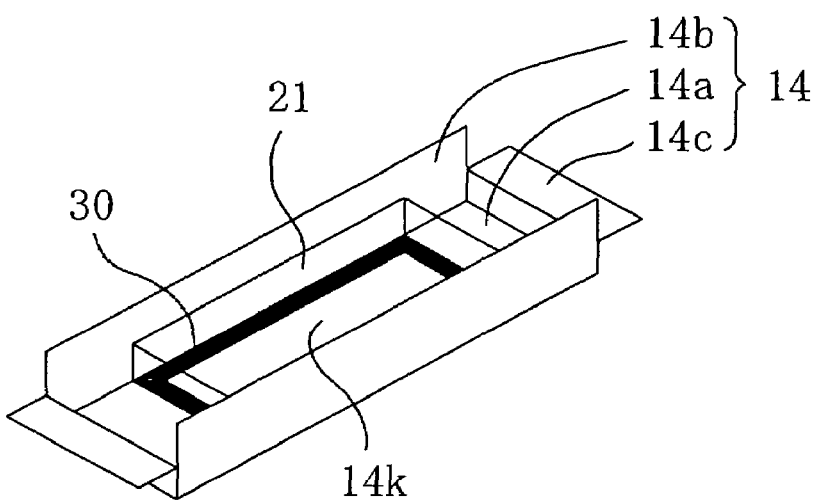
Figure 5C:
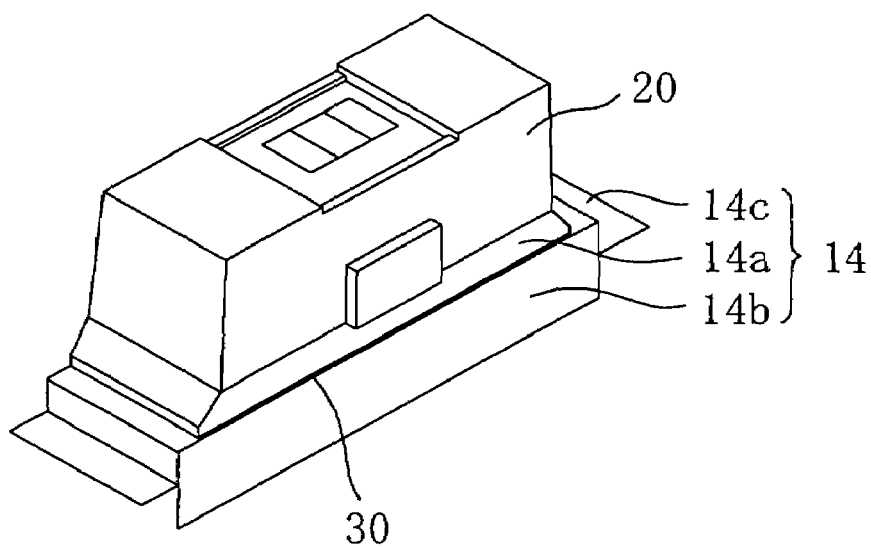

FIGS. 5A to 5C are perspective views showing the structures of three types of cap components according to the second embodiment, respectively.

The cap component shown in FIG. 5A includes a positioning frame 14 which is a frame of metal, a glass window 21 which is a light-transmitting member attached to the positioning frame 14, and an adhesive layer 30 interposed between the positioning frame 14 and the glass window 21. The positioning frame 14 includes a flat plate 14a, a pair of side plates 14b, and a pair of edge plates 14c. The flat plate 14a has a rectangular edge and a rectangular opening 14k. The pair of side plates 14b extend straight from the longer sides of the flat plate 14a in the direction orthogonal to the flat plate 14a and face each other. The pair of edge plates 14c extend straight from the shorter sides of the flat plate 14a in the direction orthogonal to the flat plate 14a and are then bent in the direction almost parallel to the flat plate 14a. The glass window 21 is attached onto the outer surface of the flat plate 14a of the positioning frame 14 so that the window blocks the opening 14k.

The cap component shown in FIG. 5B includes a positioning frame 14 which is a frame of metal, a glass window 21 which is a light-transmitting member attached to the positioning frame 14, and an adhesive layer 30 interposed between the positioning frame 14 and the glass window 21. The structure of the positioning frame 14 is the same as that shown in FIG. 5A, but it differs from that shown in FIG. 5A in that the glass window 21 is attached onto the inner surface of the flat plate 14a of the positioning frame 14.

The cap component shown in FIG. 5C includes a positioning frame 14 which is a frame of metal, a hologram 20 which is a light-transmitting member attached to the positioning frame 14, and an adhesive layer 30 interposed between the positioning frame 14 and the hologram 20. The structure of the positioning frame 14 is the same as that shown in FIG. 5A, but it differs from that shown in FIG. 5A in that instead of the glass window 21, the hologram 20 is attached onto the outer surface of the flat plate 14a of the positioning frame 14.

Figure 6A:
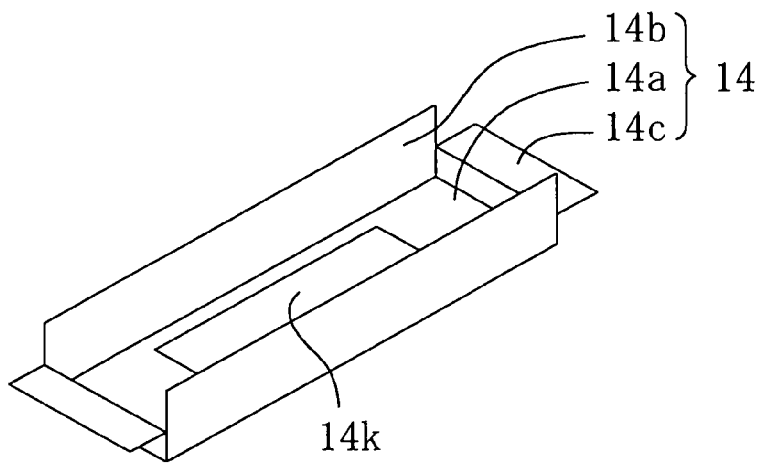
FIGS. 6A to 6C are perspective views showing formation steps of the cap components according to the second embodiment of the present invention.
Figure 6B:
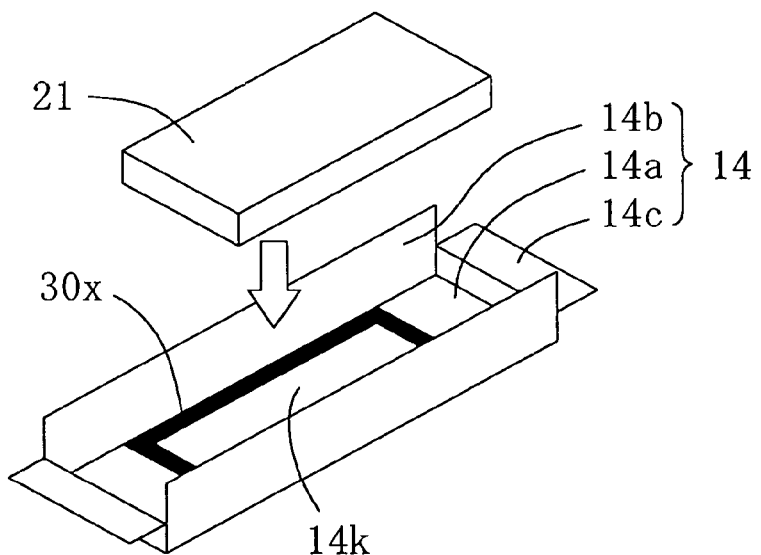
Figure 6C:
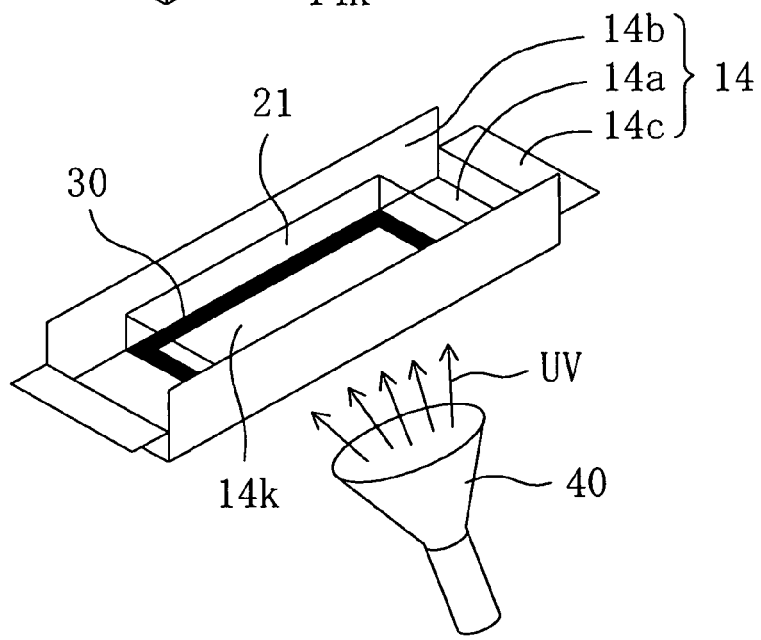

FIGS. 6A to 6C are perspective views showing formation steps of the cap components according to the second embodiment. Herein, description will be made of, as an example, formation steps of the cap component with the structure shown in FIG. 5B First, in the step shown in FIG. 6A, the positioning frame 14 is prepared which includes the flat plate 14a having the rectangular edge and the rectangular opening 14k, the pair of side plates 14b extending straight from the longer sides of the flat plate 14a in the direction orthogonal to the flat plate 14a and facing each other, and the pair of edge plates 14c extending straight from the shorter sides of the flat plate 14a in the direction orthogonal to the flat plate 14a and then bent in the direction almost parallel to the flat plate 14a.

Subsequently, in the step shown in FIG. 6B, an adhesive 30x is applied to the surrounding of the opening 14k of the flat plate 14a of the positioning frame 14, and the glass window 21 is put on the positioning frame 14 from above the positioning frame 14.

Next, in the step shown in FIG. 6C, an ultraviolet light radiation apparatus 40 is set below the positioning frame 14. Ultraviolet light UV is radiated from the side of the flat plate 14a of the positioning frame 14 opposite to the glass window 21 to cure the adhesive 30x, thereby forming the adhesive layer 30.

In the formation method of the second embodiment, ultraviolet light UV is radiated from the side of the flat plate 14a of the positioning frame 14 opposite to the glass window 21 (or the hologram 20) to cure the adhesive 30x. Thus, the light is directly radiated to the adhesive nearly overflowing from a gap between the flat plate 14a of the positioning frame 14 and the glass window 21 onto the surface of the glass window 21, so that the adhesive 30x is quickly cured to form the adhesive layer 30 and reduce the amount of the adhesive layer 30 overflowing outside the glass window 21. Consequently, the light-passing region of the light-transmitting member can be sufficiently secured, which is advantageous to downsizing of the optical device.

Figure 7A:
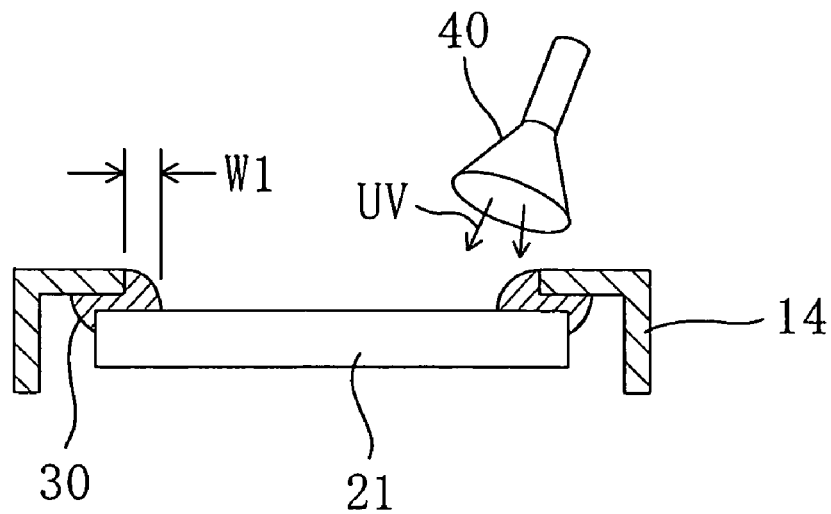
FIGS. 7A and 7B are sectional views schematically showing the shapes of adhesive layers formed by an ultraviolet light radiation method according to the second embodiment of the present invention and a conventional ultraviolet light radiation method, respectively.
Figure 7B:
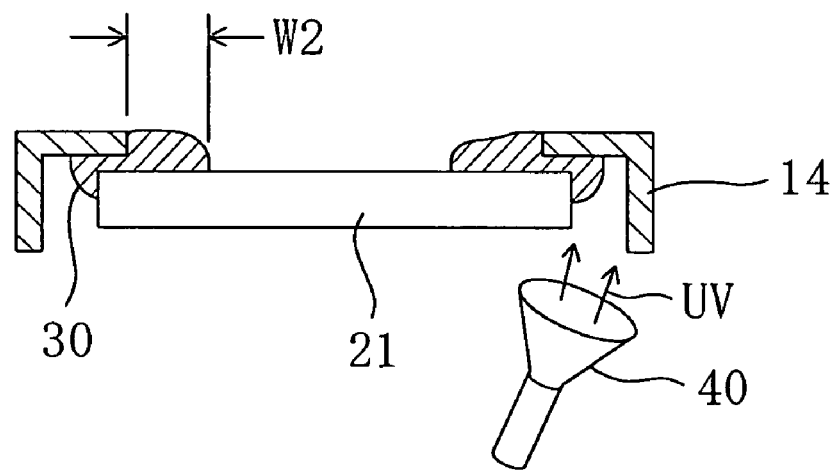

FIGS. 7A and 7B are sectional views schematically showing the shapes of the adhesive layers formed by the ultraviolet light radiation method according to the second embodiment and a conventional ultraviolet light radiation method, respectively.

As in the case of the second embodiment as shown in FIG. 7A, if ultraviolet light UV is radiated from the side of the flat plate 14a of the positioning frame 14 opposite to the glass window 21, the amount W1 of the formed adhesive layer 30 overflowing from the opening edge of the positioning frame 14 onto the light-passing region is 50 μm or smaller. On the other hands, as in the case of the conventional example, if ultraviolet light UV is radiated from the side of the glass window 21 opposite to the flat plate 14a of the positioning frame 14, the amount W2 of the formed adhesive layer 30 overflowing from the opening edge of the positioning frame 14 onto the light-passing region is 100 μm or greater. For the outward appearances, the edge of the adhesive layer 30 formed by the conventional method has the contour of soaring wave, while the edge of the adhesive layer 30 formed by the method of the second embodiment is substantially linear.

In particular, since, in curing the adhesive 30x, ultraviolet light UV is directly radiated to the portion of the flat plate 14a of the positioning frame 14 close to the adhesive 30x, the positioning frame 14 made of metal is heated by absorbing the light. Thus, even though the adhesive 30x is not heated by a heating apparatus, the temperature rise of the positioning frame 14 by radiation and absorption of the ultraviolet light UV can cure the adhesive 30x quickly. Consequently, with the second embodiment, the fabrication system thereof can be simplified to reduce manufacturing costs of the cap component, and in turn the optical device.

The device of the present invention can be utilized as an optical device such as a hologram unit which has light receiving elements and a light receiving/emitting element mounted thereon and which is incorporated in various tools and apparatuses utilizing light, in particular, laser beam.

What is claimed is:

1. An optical device comprising:
   a base;
   a flexible substrate with a wiring pattern, the flexible substrate being bent and disposed along an upper surface and both side surfaces of the base;
   an optical chip fixed on the base and electrically connected to the wiring pattern of the flexible substrate; and
   a frame fitting the flexible substrate to the base along the both side surfaces of the base and having an opening for setting a light-transmitting member over the optical chip,
   wherein the flexible substrate has an opening in a center portion thereof and a center portion of the opening of the flexible substrate is located above the base, and the optical chip is fixed on the upper surface of the base and within the opening of the flexible substrate.

2. The device of claim 1,
   wherein the frame is formed of a metal plate.

3. The device of claim 1,
   wherein the frame is fitted to the flexible substrate via an adhesive.

4. The device of claim 1,
   wherein the base is formed to fix the fixing position of the flexible substrate.

5. The device of claim 1, wherein the light-transmitting member is set in the opening of the frame.

6. The device of claim 5, wherein the light-transmitting member is a hologram.

7. The device of claim 5, wherein the light-transmitting member is a window made of glass or plastic.

8. The device of claim 1, wherein center parts of side portions of the frame are located within the opening of the flexible substrate and fitted to the base via an adhesive, and both edge parts of the side portions of the frame are fitted to the flexible substrate via an adhesive.

9. The device of claim 1, wherein the optical chip includes a light receiving element and a light emitting element.

10. The device of claim 9, wherein the light emitting element is fixed on the light receiving element.

11. An optical device comprising:
a base;
a flexible substrate with a wiring pattern, the flexible substrate being bent and disposed along an upper surface and both side surfaces of the base;
an optical chip fixed on the base and electrically connected to the wiring pattern of the flexible substrate; and
a frame fitting the flexible substrate to the base along the both side surfaces of the base and having an opening for setting a light-transmitting member over the optical chip.
wherein the flexible substrate bent and disposed along the upper surface and the both side surfaces of the base is provided at both side ends thereof with external terminals for signal connection to external equipment, and the external terminals are located below the base.

12. The device of claim 11, wherein the frame is formed of a metal plate.

13. The device of claim 11, wherein the light-transmitting member is set in the opening of the frame.

14. The device of claim 13, wherein the light-transmitting member is a hologram.

15. The device of claim 13, wherein the light-transmitting member is a window made of glass or plastic.

16. An optical device comprising:
a base
a flexible substrate with a wiring pattern, the flexible substrate being bent and disposed along an upper surface and both side surfaces of the base;
an optical chip fixed on the base and electrically connected to the wiring pattern of the flexible substrate; and
a frame fitting the flexible substrate to the base along the both side surfaces of the base and having an opening for setting a light-transmitting member over the optical chip,
wherein the wiring pattern of the flexible substrate comprises internal terminals located both sides of the opening and above the upper surface of the base and external terminals located below the base along the both side surfaces of the base, and the optical chip and the internal terminals are electrically connected to each other.

17. The device of claim 16, wherein the frame is formed of a metal plate.

18. The device of claim 16, wherein the light-transmitting member is set in the opening of the frame.

19. The device of claim 18, wherein the light-transmitting member is a hologram.

20. The device of claim 18, wherein the light-transmitting member is a window made of glass or plastic.

* * * * *